US012615718B2

(12) United States Patent (10) Patent No.: US 12,615,718 B2
Becker et al. (45) Date of Patent: Apr. 28, 2026

(54) EFFLUENT MANAGEMENT INLINE CLEANER

(71) Applicant: Illinois Tool Works Inc., Glenview, IL (US)

(72) Inventors: Eric Wayne Becker, Phillipsburg, MO (US); Rodney Chilton, Lake Ozark, MO (US)

(73) Assignee: Illinois Tool Works Inc., Glenview, IL (US)

( * ) Notice: Subject to any disclaimer, the term of this patent is extended or adjusted under 35 U.S.C. 154(b) by 69 days.

(21) Appl. No.: 18/598,406

(22) Filed: Mar. 7, 2024

(65) Prior Publication Data

US 2025/0287512 A1 Sep. 11, 2025

(51) Int. Cl.
 B08B 3/08 (2006.01)
 B01D 41/00 (2006.01)
 B08B 3/14 (2006.01)
 H05K 3/26 (2006.01)
(52) U.S. Cl.
 CPC .............. H05K 3/26 (2013.01); B01D 41/00 (2013.01); B08B 3/08 (2013.01); B08B 3/14 (2013.01)
(58) Field of Classification Search
 CPC .. H05K 3/26; B01D 41/00; B08B 3/08; B08B 3/14
 USPC .......................................................... 134/109
 See application file for complete search history.

(56) References Cited

U.S. PATENT DOCUMENTS

| | | | | |
|---|---|---|---|---|
| 2001/0034190 A1* | 10/2001 | Tanikawa | ................ | B24B 37/04 451/41 |
| 2005/0258085 A1* | 11/2005 | Hiroe | ...................... | C02F 1/325 210/167.31 |
| 2014/0158617 A1* | 6/2014 | Dale | ...................... | B01D 29/52 210/636 |
| 2019/0111391 A1 | 4/2019 | Iino et al. | | |
| 2023/0356151 A1 | 11/2023 | Kamimura et al. | | |
| 2024/0047234 A1* | 2/2024 | Hachiya | ............ | H01L 21/67051 |

FOREIGN PATENT DOCUMENTS

| | | | | | |
|---|---|---|---|---|---|
| CN | 106733882 A | * | 5/2017 | ................ | C02F 1/32 |
| JP | 4923062 B2 | | 4/2012 | | |

OTHER PUBLICATIONS

CN106733882A—machine translation (Year: 2017).*

* cited by examiner

*Primary Examiner* — Tinsae B Ayalew
(74) *Attorney, Agent, or Firm* — Lando & Anastasi, LLP

(57) ABSTRACT

A cleaning apparatus for cleaning electronic substrates includes a rinse module having a rinse station configured to perform a rinse of electronic substrates and a rinse tank in fluid communication with the rinse station and configured to receive effluent from the rinse station. The cleaning apparatus further includes an effluent management and filtration system in fluid communication with the rinse tank. The effluent management and filtration system includes a pump in fluid communication with the rinse tank, the pump being configured to pump effluent from the rinse tank, a first filter in fluid communication with the pump, the first filter being configured to remove larger particles from the effluent, and a second filter in fluid communication with the first filter and the rinse tank, the second filter being configured to break down organics matter from the effluent.

17 Claims, 2 Drawing Sheets

EFFLUENT MANAGEMENT INLINE CLEANER

BACKGROUND OF THE DISCLOSURE

1. Field of the Disclosure

This application relates generally to an apparatus for cleaning electronic substrates, including printed circuit boards and semiconductor product assemblies, and, more particularly, to a system and a method to filter and clean contaminated water, sometimes referred to as effluent, within a cleaning apparatus.

2. Discussion of Related Art

Various types of liquid cleaning apparatus, often referred to as cleaners or cleaning machines, are used to clean electronic substrates and to remove contaminates, such as flux residues, resins and the like. Typically, these contaminates can remain on the electronic substrate from a soldering process.

The soldering process has recently advanced in two significant ways—the transition from tin-lead solder to lead-free materials and the reduction in the size of electronic substrate and the associated increase in the density of smaller, low-profile components. These new soldering materials have increased temperature requirements for soldering and are typically formulated to have higher flux content by weight. The combination of lead-free processes and new electronic substrate designs are demanding more time and energy to meet industry cleanliness standards.

Cleaners are used to clean unwanted materials left by the soldering process from the electronic substrate. Such cleaners are equipped with one or more cleaning modules to clean the electronic substrate, including a wash station and a rinse station. As a conveyor of the cleaning apparatus passes through the wash station, the conveyor picks up unwanted chemistry and contaminants. These unwanted contaminants are typically removed in a chemical isolation section of a rinse tank of the rinse station. The contaminants are too diluted to go back to the wash station and too contaminated to go into the rinse station. The contaminated water is removed from the cleaning apparatus through a drain provided in the rinse tank, which may be undesirable.

SUMMARY OF THE DISCLOSURE

One aspect of the present disclosure is directed to a cleaning apparatus for cleaning electronic substrates including printed circuit boards and semiconductor product assemblies. In one embodiment, the cleaning apparatus comprises a rinse module including a rinse station configured to perform a rinse of electronic substrates and a rinse tank in fluid communication with the rinse station and configured to receive effluent from the rinse station. The cleaning apparatus further comprises an effluent management and filtration system in fluid communication with the rinse tank. The effluent management and filtration system includes a pump in fluid communication with the rinse tank, the pump being configured to pump effluent from the rinse tank, a first filter in fluid communication with the pump, the first filter being configured to remove larger particles from the effluent, and a second filter in fluid communication with the first filter and the rinse tank, the second filter being configured to break down organics matter from the effluent.

Embodiments of the cleaning apparatus further may include configuring the rinse tank with a chemical isolation return, which is in fluid communication with the pump. The rinse module further may include a chemical isolation station in fluid communication with the rinse station and the chemical isolation return of the rinse tank. The rinse module further may include a final rinse station in fluid communication with the rinse tank, with the final rinse station being configured to perform a final rinse of electronic substrates. The effluent management and filtration system further may include a first valve configured to control the flow of effluent to the first filter and a second valve configured to control the flow of effluent from the first filter to the second filter. The cleaning apparatus further may include a wash module including a wash station configured to wash electronic substrates and a wash tank in fluid communication with the wash station. The wash tank may be configured to receive effluent from the wash station. The effluent management and filtration system further may include a third valve configured to control the flow of effluent from the first filter to the wash tank. The third valve further may be configured to control the flow effluent to a chemical isolation return of the rinse tank. The cleaning apparatus further may include a controller coupled to the pump, the first valve and the second valve to control the flow of effluent through the effluent management and filtration system. The cleaning apparatus further may include a deionized water feed configured to deliver deionized water to the final rinse station. The deionized water feed further may be configured to deliver deionized water to at least one of the first filter and the second filter to perform a backflow cleaning operation. The first filter may be a ceramic water filter and the organics filter may be configured to apply an advanced oxidation process using ultraviolet (UV) light to break down the organics left in the effluent.

Another aspect of the present disclosure is directed to a method of removing contaminants from effluent within a cleaning apparatus including a rinse module having a rinse station configured to perform a rinse of electronic substrates and a rinse tank in fluid communication with the rinse station and configured to receive effluent from the rinse station. In one embodiment, the method comprises: transporting an electronic substrate by the conveyor system through the rinse module; pumping effluent from the rinse tank to a first filter with a pump; performing a filter operation of effluent with the first filter; delivering effluent from the first filter to a second filter; performing a filter operation of effluent with the second filter; and returning filtered effluent to the rinse tank.

Embodiments of the method further may include controlling a flow of effluent from the pump to the first filter with a first valve. The method further may include controlling a flow of effluent from the first filter to the second filter with a second valve. The method further may include controlling a flow of effluent from the first filter to a wash tank of a wash module having a wash station configured to wash electronic substrates. The method further may include controlling a flow of effluent from the first filter to a chemical isolation return of the rinse tank. The method further may include delivering deionized water to a final rinse station of the rinse module. The method further may include delivering deionized water to the second filter to perform a backflow cleaning operation of the second filter.

Yet another aspect of the present disclosure is directed to an effluent management and filtration system of a cleaning apparatus configured to clean electronic substrates including printed circuit boards and semiconductor products assemblies. In one embodiment, the effluent management and filtration system comprises a pump in fluid communication with a rinse tank of a rinse module, the pump being configured to pump effluent from the rinse tank, a first filter in fluid communication with the pump, the first filter being configured to remove larger particles from the effluent, and a second filter in fluid communication with the first filter and the rinse tank, the second filter being configured to break down organics matter from the effluent.

Embodiments of the effluent management and filtration system further may include configuring the rinse tank with a chemical isolation return, which is in fluid communication with the pump. The rinse module further may include a chemical isolation station in fluid communication with a rinse station and the chemical isolation return of the rinse tank. The rinse module further may include a final rinse station in fluid communication with the rinse tank, with the final rinse station being configured to perform a final rinse of electronic substrates. The effluent management and filtration system further may include a first valve configured to control the flow of effluent to the first filter and a second valve configured to control the flow of effluent from the first filter to the second filter. The effluent management and filtration system further may include a third valve configured to control the flow of effluent from the first filter to a wash tank of a wash module. The third valve further may be configured to control the flow effluent to a chemical isolation return of the rinse tank. The effluent management and filtration system further may include a controller coupled to the pump, with the first valve and the second valve to control the flow of effluent through the effluent management and filtration system. A deionized water feed may be configured to deliver deionized water to the final rinse station. The deionized water feed further may be configured to deliver deionized water to at least one of the first filter and the second filter to perform a backflow cleaning operation. The first filter may be a ceramic water filter and the organics filter may be configured to apply an advanced oxidation process using ultraviolet (UV) light to break down the organics left in the effluent.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
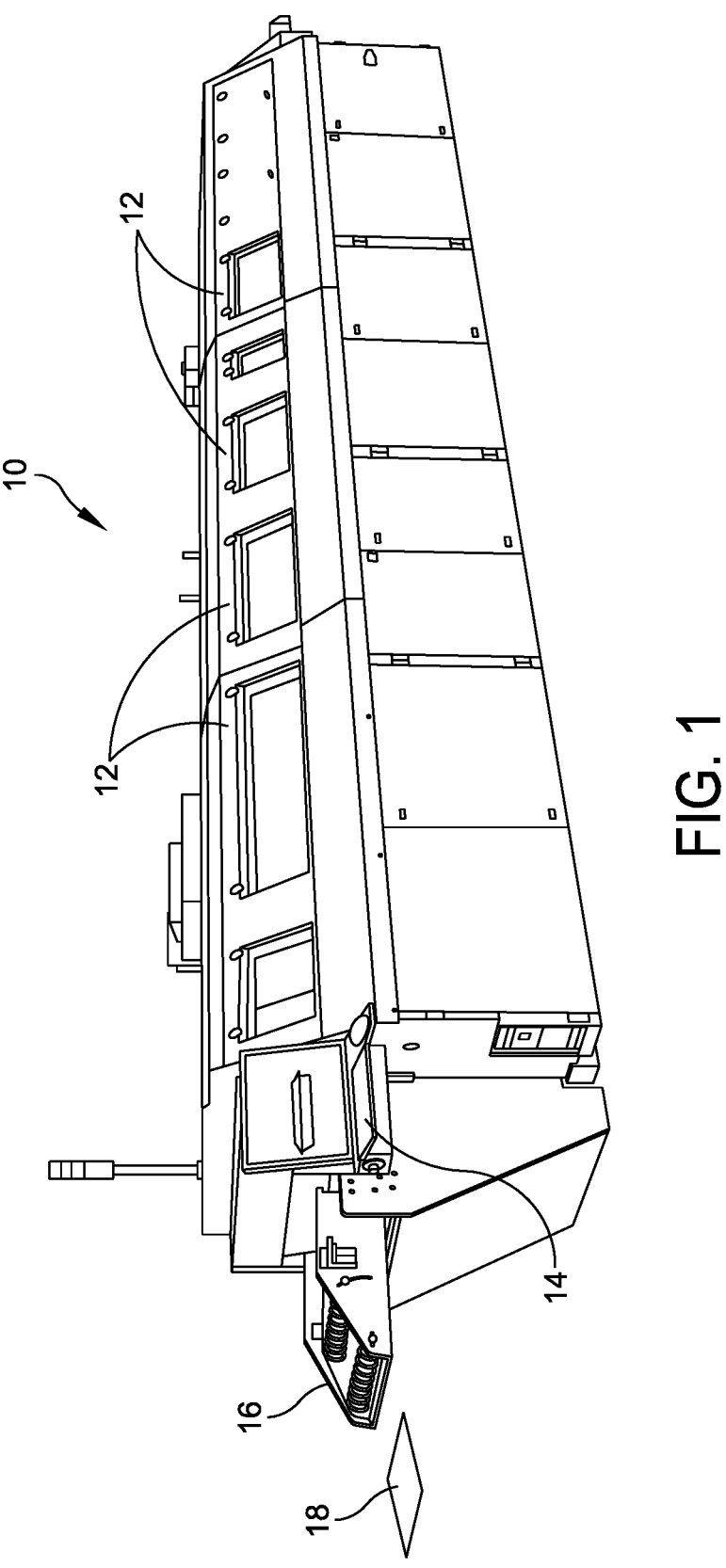
FIG. 1 is a perspective view of an electronic substrate cleaning apparatus.

Solder paste is routinely used in the assembly of electronic substrates, including printed circuit boards and semiconductor product assemblies, where the solder paste is used to join electronic components to the substrate. Solder paste includes solder for joint formation and flux for preparing metal surfaces for solder attachment. The solder paste may be deposited onto the metal surfaces (e.g., electronic pads) provided on the electronic substrate by using any number of application methods. In one example, a stencil printer may employ a squeegee to force the solder paste through a metallic stencil laid over an exposed surface of the electronic substrate. In another example, a dispenser may dispense solder paste material onto specific areas of the electronic substrate. Leads of an electronic component are aligned with and impressed into the solder deposits to form the assembly. In reflow soldering processes, the solder is then heated to a temperature sufficient to melt the solder and cooled to permanently couple the electronic component, both electrically and mechanically, to the electronic substrate. The solder typically includes an alloy having a melting temperature lower than that of the metal surfaces to be joined. The temperature also must be sufficiently low so as to not cause damage to the electronic component. In certain embodiments, the solder may be a tin-lead alloy. However, solders employing lead-free materials may also be used. Another process to attach components onto electronic substrates is a wave soldering process.

In the solder, the flux typically includes a vehicle, solvent, activators and other additives. The vehicle is a solid or nonvolatile liquid that coats the surface to be soldered and can include rosin, resins, glycols, polyglycols, polyglycol surfactants, and glycerine. The solvent, which evaporates during the pre-heat and soldering process, serves to dissolve the vehicle activators, and other additives. Examples of typical solvents include alcohols, glycols, glycol esters and/or glycol ethers and water. The activator enhances the removal of metal oxide from the surfaces to be soldered. Common activators include amine hydrochlorides, dicarboxylic acids, such as adipic or succinic acid, and organic acids, such as citric, malic or abietic acid. Other flux additives can include surfactants, viscosity modifiers and additives for providing low slump or good tack characteristics for holding the components in place before reflow.

As mentioned above, the soldering processes described herein leave unwanted contaminations on the electronic substrate, which must be cleaned prior to being released for use. Disclosed herein is an inline cleaning process to remove undesired contaminations from effluent used in the manufacturing process. Specifically, a cleaning apparatus is used to clean unwanted materials left by the soldering process from the electronic substrate. Embodiments of the present disclosure are directed to a cleaning apparatus in which a height of spray nozzles of the cleaning apparatus can be automatically adjusted to adjust a distance between the spray nozzles and the electronic substrate that is being cleaned.

It is to be appreciated that embodiments of the systems and apparatuses discussed herein are not limited in application to the details of construction and the arrangement of components set forth in the following description or illustrated in the accompanying drawings. The systems and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Referring now to the drawings, and more particularly to FIG. 1, an electronic substrate cleaning apparatus is generally indicated at 10. As shown, the cleaning apparatus 10 is an elongate structure that includes several modules, each indicated at 12, to clean and process electronic substrates. In one exemplary embodiment, the cleaning apparatus 10 includes, one or more of the following modules: a pre-wash module, a wash module, a pre-rinse module, a rinse module, and a dry module. Electronic substrates traveling through the cleaning apparatus 10 are cleaned in the pre-wash and wash modules, rinsed in the pre-rinse and rinse modules, and dried in the dry module. A control module having a user interface together indicated at 14 provides an operator the ability to program and monitor the cleaning apparatus 10. In certain embodiments, the cleaning apparatus 10 may include a Aquastorm® series cleaner platform offered by Electrovert Cleaners, ITW Electronic Assembly Equipment of Camdenton, Missouri.

The cleaning apparatus 10 further includes an elongate conveyor 16 that is configured to transport electronic substrates, such as electronic substrate 18, through the modules 12 of the cleaning apparatus. The conveyor 16 is designed to securely hold electronic substrates during the sometimes rigorous cleaning processes. Sometimes trays are used to support the items being transported through the cleaning apparatus 10 by the conveyor 16 for cleaning. Embodiments of the present disclosure are directed to cleaning wastewater resulting from this cleaning process thereby reducing the need to dispense the wastewater through the drain. In one embodiment, the cleaning apparatus 10 is configured to clean used water by a filtration process so that the water can be reused within the cleaning apparatus.

Figure 2:
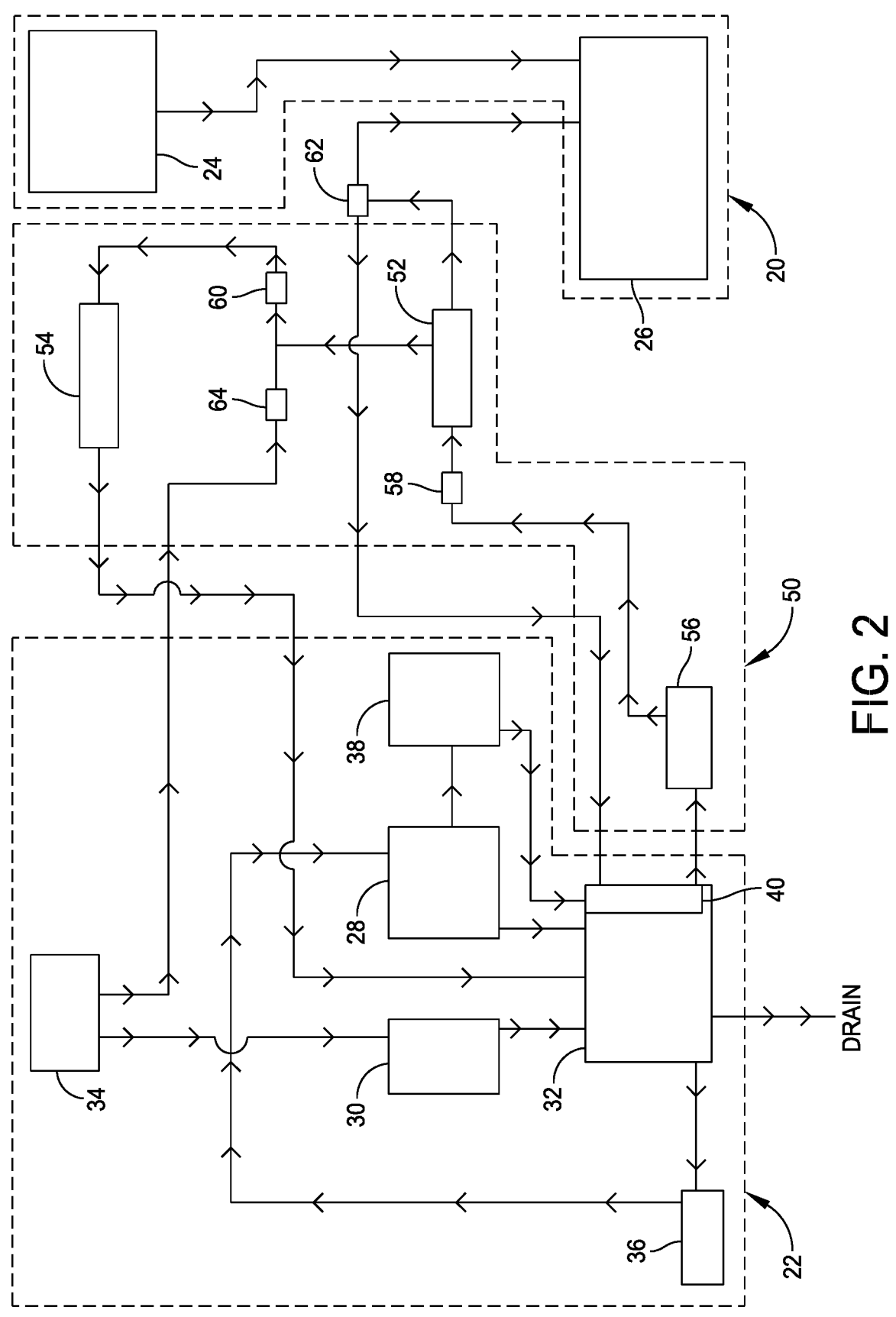
FIG. 2 is a schematic view of a portion of the cleaning apparatus.

Referring to FIG. 2, a wash module is generally indicated at 20 and a rinse module is generally indicated at 22. As shown, the wash module 20 includes a wash station 24 and a wash tank 26 in fluid communication with the wash station. Objects, such as electronic substrate 18, washed in the wash module 20 travel to the rinse module 22 for rinsing. The wash station 24 of the wash module 20 is provided to wash or otherwise clean the electronic substrates, removing contaminants from the electronic substrates. Water used to wash the electronic substrates in the wash station 24 is delivered to the wash tank 26, where the used or contaminated water or effluent may be treated in the manner described below.

As shown in FIG. 2, the rinse module 22 includes a rinse station 28, a final rinse station 30, and a rinse tank 32. As its name implies, the rinse station 28 and the final rinse station 30 are provided to rinse away contaminants and other unwanted material remaining on the electronic substrates after the wash station 24 of the wash module 20. The rinse station 28 and the final rinse station 30 are in fluid communication with the rinse tank 32. Specifically, used or contaminated water (effluent) generated in the rinse station 28 and the final rinse station 30 is drained into the rinse tank 32. Used water is drained from the rinse station 28 and the final rinse station 30 into the rinse tank 32. The rinse module 22 further includes a deionized (DI) water feed 34 configured to deliver deionized water to the final rinse station 30. As shown, the DI water feed 34 is in fluid communication with the final rinse station 30 to supply deionized water to the final rinse station. Further, the DI water feed 34 can supply deionized water to the wash station 24 of the wash module 20. Although deionized water is identified, any type of purified water suitable to remove contamination from the electronic substrates can be employed.

Water delivered to the rinse tank 32 by the rinse station 28 and the final rinse station 30 can be recycled within the cleaning apparatus 10. Specifically, the rinse module 22 further includes a pump 36, which is configured to pump water from the rinse tank 32 back to the rinse station 28 to perform the rinse function prior to the final rinse function at the final rinse station 30. As contaminants build up within the rinse station 28, water is diverted to a chemical isolation station 38 to isolate contaminated water. This contaminated water is delivered from the chemical isolation station 38 to a chemical isolation return 40 associated with the rinse tank. In one embodiment, the chemical isolation return 40 is part of the rinse tank 32. As discussed above, this contaminated water is typically discharged from the rinse tank 32 by a drain.

Aspects of the present disclosure are directed to an effluent management and filtration system, which is generally indicated at 50 in FIG. 2. As is known, filtration is a physical separation process that is designed to separate solid matter and particles from a fluid, typically by means of a filter or filter medium having a structure through which only fluid can pass. The solid particles that cannot pass through the filter can be identified as the filtrate. As shown, the effluent management and filtration system 50 includes a multi-stage system, namely a solids filter 52 and an organics filter 54. As used herein, the solids filter 52 is sometimes referred to as a first filter and the organics filter 54 is sometimes referred to as a second filter.

The effluent management and filtration system 50 further includes a pump 56 configured to pump contaminated water from the chemical isolation return 40 of the rinse tank 32 to the solids filter 52. As will be described in greater detail below, the solids filter 52 is configured to remove larger particles from the effluent. Once filtered by the solids filter, the water is delivered to the organics filter 54. Specifically, pressurized effluent flows from the solids filter 52 to the organics filter 54. As will further be described in greater detail below, the organics filter 54 is configured to break down organics matter from the effluent. Once the multi-stage filtration process is completed, the treated water is returned to the rinse tank 32.

The effluent management and filtration system 50 further includes several valves to control the flow of effluent to the solids filter 52, the organics filter 54 and the wash tank 26 associated with the wash module 20. In one embodiment, a valve 58 is provided between the pump 56 and the solids filter 52 to control the flow of effluent from the chemical isolation return 40 of the rinse tank 32 to the solids filter. As used herein, valve 58 is sometimes referred to as a first valve. Another valve 60 is provided between the solids filter 52 and the organics filter 54 to control the flow of effluent treated by solids filter to the organics filter. As used herein valve 60 is sometimes referred to as a second valve.

Yet another valve 62 is provided between the solids filter 52 and the wash tank 26 of the wash module 20 to divert flow to the wash tank during a backflush operation. Specifically, the valve 62 is opened during a backflush operation of untreated water with contaminants being sent back to the wash tank 26. During normal operation, the valve 62 is configured to enable flow of effluent through the solids filter 52 and back to the chemical isolation return 40 of the rinse tank 32.

In one embodiment, a controller, such as the control module 14 of the cleaning apparatus 10, is coupled to the pump 56 and valves 58, 60, 62 to control the flow of effluent through the effluent management and filtration system 50. During a "normal" cycle, the valve 58 is in an open state to enable contaminated effluent to be pumped from the chemical isolation return 40 to the solids filter 52 by the pump 56. The valve 60 also is an open state to enable effluent under pressure and treated by the solids filter 52 to flow to the organics filter 54. The fully treated water under pressure flows back to the rinse tank 32. At the rinse tank 32, the treated water can be used to perform the rinse function at the rinse station 28, with pump 36 controlling the flow of treated water to the rinse station. The controller further is configured to control the pump 36.

To clean the solids filter 52, valve 58 is closed and, although not shown, the DI water feed 34 is configured to deliver deionized water to the solids filter to clean the solids filter. When cleaning the solids filter 52, the valve 62 is opened to enable flow of backflush solids to the wash tank 26.

To clean the organics filter 54, the DI water feed 34 is configured to deliver deionized water to the organics filter. Another valve 64 is provided between the DI water feed 34 and valve 60 to control the flow of deionized water to the organics filter 54. The deionized water delivered to the organics filter 54 is provided to perform a backflow cleaning operation of the organics filter. As shown, valve 64 and valve 60 control the flow of deionized water to the organics filter 54. As with valves 58, 60, 62, valve 64 is coupled to the controller to control the flow of deionized water. Once the deionized water travels through the organics filter 54, the water is returned to the rinse tank 32.

In one embodiment, the solids filter 52 is a ceramic water filter having small pore size of ceramic material to filter particulate matter from the water. As is known, the ceramic water filter is used to capture micro particles in the water.

In one embodiment, the organics filter 54 is a water filter specifically designed to break down organics matter from the effluent. In a particular embodiment, the organics filter 54 is configured to apply an advanced oxidation process using ultraviolet (UV) light to break down the organics left in the effluent. A titanium dioxide tube with a UV light can be employed for this process. Other types of organics filters, such as carbon filters, can be used in addition to or in place of the titanium dioxide tube.

It should be observed that the effluent management and filtration system 50 provides a closed loop system to remove contaminates from effluent. In some embodiments, nearly all water used within the rinse module 22 can be recycled and an reused.

A process for removing contaminated material from the effluent is further provided. Such a process can include three stages or steps. In one embodiment, stage 1 includes collecting the contaminated material from the effluent in the chemical isolation return 40. Next, stage 2 includes operating the pump 56 to drive the movement of the contaminated material to the solids filter 52 to remove larger contaminants. Next, stage 3 includes delivering the filtered effluent from the solids filter 52 to the organics filter 54, e.g., the titanium dioxide tube, which provides an advanced oxidation process using UV light to break down the organics left in the filtered effluent. Once treated by the solids filter 52 and the organics filter 54, the treated water is delivered to the rinse tank 32 and ultimately to the DI generation system to be recycled.

The process further includes cleaning the filters, including cleaning the solids filter 52 and the organics filter 54 as described above. Specifically, the solids filter 52 can be cleaned offline by an automatic back flush of the solids filter that will open the pores of the solids filter.

It is to be understood that the above description is intended by way of illustration and example only and is not intended to be taken by way of limitation, and that changes and modifications are possible. For example, the cleaning apparatus 10 described above may be any type of cleaning machine that is used to clean electronic substrates. Accordingly, other embodiments are contemplated, and modifications and changes could be made without departing from the scope of this application.

In one embodiment, the control module 14 of the cleaning apparatus 10 is configured with an operating system, e.g., a Windows®-based operating system, which provides familiar pull-down menus and has data-logging and barcode capability. The operating system is easily networked for downloading of recipes and remote access to operating data. The user interface enables quick and easy viewing of system pressures, water levels, pump and blower operation, temperature, and fill/drain operation. Moreover, the user interface can be configured to control the operation of the adjustable height spray system, and in particular, the actuator.

Various controllers, such as the control module 14, may execute various operations discussed above. Using data stored in associated memory and/or storage, the control module 14 also executes one or more instructions stored on one or more non-transitory computer-readable media, which the control module 14 may include and/or be coupled to, that may result in manipulated data. In some examples, the control module 14 may include one or more processors or other types of controllers. In one example, the control module 14 is or includes at least one processor. In another example, the control module 14 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Many process parameters may be configured in a computer-controlled operator interface provided in the cleaning apparatus 10. System pressure, water levels, and temperatures are easily accessed. Data logging and barcode capability are features that enhance and streamline the production process.

In some embodiments, the cleaning apparatus 10 can include one or more rear panels, which can be easily removed for maintenance. Front doors further can be provided to provide quick access to electrical panels, computer, heaters, floats, thermocouples, and components of the effluent management and filtration system. The cleaning apparatus 10 can include hinged, tempered glass windows to provide optimum viewing and access.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

9

10

What is claimed is:

1. A cleaning apparatus for cleaning electronic substrates including printed circuit boards and semiconductor product assemblies, the cleaning apparatus comprising:

a rinse module including a rinse station configured to perform a rinse of electronic substrates and a rinse tank in fluid communication with the rinse station and configured to receive effluent from the rinse station;

a wash module including a wash station configured to wash electronic substrates and a wash tank in fluid communication with the wash station, the wash tank being configured to receive effluent from the wash station; and an effluent management and filtration system in fluid communication with the rinse tank, the effluent management and filtration system including a pump in fluid communication with the rinse tank, the pump being configured to pump effluent from the rinse tank, a first filter in fluid communication with the pump, the first filter being configured to remove particles from the effluent, a second filter in fluid communication with the first filter and the rinse tank, the second filter being configured to break down organics matter from the effluent, a first valve configured to control the flow of effluent to the first filter, and a second valve configured to control the flow of effluent from the first filter to the second filter, and a third valve configured to control the flow of effluent from the first filter to the wash tank.

2. The cleaning apparatus of claim 1, wherein the rinse tank includes a chemical isolation return, which is in fluid communication with the pump.

3. The cleaning apparatus of claim 2, wherein the rinse module further includes a chemical isolation station in fluid communication with the rinse station and the chemical isolation return of the rinse tank.

4. The cleaning apparatus of claim 1, wherein the rinse module further includes a final rinse station in fluid communication with the rinse tank, the final rinse station being configured to perform a final rinse of electronic substrates.

5. The cleaning apparatus of claim 1, wherein the third valve further is configured to control the flow effluent to a chemical isolation return of the rinse tank.

6. The cleaning apparatus of claim 1, further comprising a controller coupled to the pump, the first valve, the second valve, and the third valve to control the flow of effluent through the effluent management and filtration system.

7. The cleaning apparatus of claim 1, further comprising a deionized water feed configured to deliver deionized water to a final rinse station.

8. The cleaning apparatus of claim 7, wherein the deionized water feed further is configured to deliver deionized water to at least one of the first filter and the second filter to perform a backflow cleaning operation.

9. The cleaning apparatus of claim 1, wherein the first filter is a ceramic water filter and the organics filter is configured to apply an advanced oxidation process using ultraviolet (UV) light to break down the organics left in the effluent.

10. A method of removing contaminants from effluent within the cleaning apparatus of claim 1, the method comprising:

transporting an electronic substrate by the conveyor system through the rinse module;

pumping effluent from the rinse tank to the first filter with the pump;

performing a filter operation of effluent with the first filter;

delivering effluent from the first filter to the second filter;

performing a filter operation of effluent with the second filter; and returning filtered effluent to the rinse tank.

11. The method of claim 10, further comprising controlling a flow of effluent from the pump to the first filter with the first valve.

12. The method of claim 11, further comprising controlling a flow of effluent from the first filter to the second filter with the second valve.

13. The method of claim 12, further comprising controlling a flow of effluent from the first filter to a wash tank of a wash module having a wash station configured to wash electronic substrates.

14. The method of claim 13, further comprising controlling a flow of effluent from the first filter to a chemical isolation return of the rinse tank.

15. The method of claim 10, further comprising delivering deionized water to a final rinse station of the rinse module.

16. The method of claim 15, further comprising delivering deionized water to at least one of the first filter and the second filter to perform a backflow cleaning operation.

17. An effluent management and filtration system of a cleaning apparatus configured to clean electronic substrates including printed circuit boards and semiconductor products assemblies, the effluent management and filtration system comprising:

a pump in fluid communication with a rinse tank of a rinse module, the pump being configured to pump effluent from the rinse tank;

a first filter in fluid communication with the pump, the first filter being configured to remove particles from the effluent;

a second filter in fluid communication with the first filter and the rinse tank, the second filter being configured to break down organics matter from the effluent;

a first valve configured to control the flow of effluent to the first filter;

a second valve configured to control the flow of effluent from the first filter to the second filter; and a third valve configured to control the flow of effluent from the first filter to a wash tank of a wash module, the wash tank being in fluid communication with a wash station and configured to receive effluent from the wash station.

* * * * *